United States Patent
Ling et al.

(10) Patent No.: US 10,803,282 B2
(45) Date of Patent: *Oct. 13, 2020

(54) SELF-LUMINOUS DISPLAY PIXEL

(71) Applicant: Shanghai Oxi Technology Co., Ltd, Shanghai (CN)

(72) Inventors: Yan Ling, Shanghai (CN); Hong Zhu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 157 days.

This patent is subject to a terminal disclaimer.

(21) Appl. No.: 15/576,242

(22) PCT Filed: Feb. 15, 2017

(86) PCT No.: PCT/CN2017/073618
§ 371 (c)(1),
(2) Date: Nov. 21, 2017

(87) PCT Pub. No.: WO2018/040513
PCT Pub. Date: Mar. 8, 2018

(65) Prior Publication Data
US 2018/0373915 A1  Dec. 27, 2018

(30) Foreign Application Priority Data
Aug. 31, 2016 (CN) .......................... 2016 1 0787024

(51) Int. Cl.
*G06K 9/00* (2006.01)
*H01L 27/32* (2006.01)
(Continued)

(52) U.S. Cl.
CPC ........ *G06K 9/0004* (2013.01); *H01L 27/3227* (2013.01); *H01L 27/3234* (2013.01);
(Continued)

(58) Field of Classification Search
CPC .............. G06K 9/0004; H01L 27/3234; H01L 31/02327; H01L 27/3227;
(Continued)

(56) References Cited

U.S. PATENT DOCUMENTS 10,580,839 B2 *  3/2020  Ling ................. H01L 27/14612
2010/0134735 A1  6/2010  Nakamura
(Continued)

FOREIGN PATENT DOCUMENTS

CN  103928477      7/2014
CN  105304656 A    2/2016
(Continued)

OTHER PUBLICATIONS

English Translation of CN105552159A (Year: 2016).*
(Continued)

*Primary Examiner* — Jon Chang
(74) *Attorney, Agent, or Firm* — Adsero IP

(57) ABSTRACT

A self-luminous display pixel is provided, including: a self-luminous circuit which includes a self-luminous device, wherein the self-luminous display pixel further include an optical fingerprint sensing circuit, wherein the optical fingerprint sensing circuit comprises a first TFT device and a photosensitive device, and a channel layer of the first TFT device is disposed right under a portion of the photosensitive device. The self-luminous display pixel provides a fingerprint sensing function, and possesses an improved structure.

8 Claims, 2 Drawing Sheets

(51) Int. Cl.
  *H01L 31/0224*  (2006.01)
  *H01L 31/0232*  (2014.01)
  *H01L 31/103*  (2006.01)
  *H01L 31/105*  (2006.01)
(52) U.S. Cl.
  CPC ............... *H01L 31/02327* (2013.01); *H01L 31/022408* (2013.01); *H01L 27/3272* (2013.01); *H01L 31/103* (2013.01); *H01L 31/105* (2013.01)
(58) Field of Classification Search
  CPC ......... H01L 31/022408; H01L 27/3272; H01L 31/105; H01L 31/103
  See application file for complete search history.

(56) References Cited

U.S. PATENT DOCUMENTS

2012/0092302 A1* 4/2012 Imai ..................... G06F 3/0412
                                                        345/175
2015/0369661 A1    12/2015 Lin
2017/0032167 A1*  2/2017 Chen ................... H01L 27/3227
2017/0124370 A1*  5/2017 He ....................... G06K 9/0012

FOREIGN PATENT DOCUMENTS

| CN | 101753861 | 5/2016 |
| CN | 105552159 | 5/2016 |
| CN | 106229331 | 12/2016 |

OTHER PUBLICATIONS

International Search Report from PCT/CN2017/073618 dated Aug. 31, 2016.
Office Action from App No. CN 201610787024.5 dated Aug. 17, 2018 with English Summary.

* cited by examiner

SELF-LUMINOUS DISPLAY PIXEL

CROSS-REFERENCE TO RELATED APPLICATIONS

This application is the national phase of International Application No. PCT/CN2017/073618, filed on Feb. 15, 2017, which claims the benefit of priority to Chinese Patent Application No. 201610787024.5, filed on Aug. 31, 2016, and entitled "SELF-LUMINOUS DISPLAY PIXEL", the entire disclosure of which are incorporated herein by reference.

TECHNICAL FIELD

The present disclosure generally relates to photoelectric display field, and more particularly, to a self-luminous display pixel.

BACKGROUND

Display panels are generally used to display output information of electronic products. A display panel generally includes an array substrate, and the array substrate includes display pixels. In all types of display pixel, as a self-luminous display pixel does not require a backlight source, a display panel including self-luminous display pixels is advantageous in weight, size and power consumption. Therefore, the display panel including self-luminous display pixels is an important development direction of the current display panels.

However, structures and functions of existing self-luminous display pixels need to be improved.

To improve the structures and functions of the existing self-luminous display pixels, new design and optimization on the existing self-luminous display pixels are needed.

SUMMARY

In embodiments of the present disclosure, a self-luminous display pixel is provided with improved structures and functions.

In an embodiment of the present disclosure, a self-luminous display pixel is provided, including: a self-luminous circuit which includes a self-luminous device, wherein the self-luminous display pixel further includes an optical fingerprint sensing circuit, wherein the optical fingerprint sensing circuit includes a first Thin Film Transistor (TFT) device and a photosensitive device, and a channel layer of the first TFT device is disposed right under a portion of the photosensitive device.

Optionally, the photosensitive device may further include a lower electrode layer which is a light-blocking layer, the channel layer of the first TFT device may be disposed right under a portion of the lower electrode layer, and the photosensitive device may include a photosensitive semiconductor layer which is a PIN diode or a PN diode.

Optionally, the photosensitive device may include a photosensitive semiconductor layer, the self-luminous device may include a self-luminous semiconductor layer, and the self-luminous display pixel may further include a TFT protective layer, wherein the photosensitive semiconductor layer and the self-luminous semiconductor layer are disposed above an upper surface of the TFT protective layer, and the photosensitive semiconductor layer is a PIN diode or a PN diode.

Optionally, the photosensitive device may further include a lower electrode layer which is a light-blocking layer.

Optionally, a gate layer of the first TFT device may be disposed below the channel layer of the first TFT device, the optical fingerprint sensing circuit may further include an electrode layer which is disposed at a same layer as the gate layer and below the photosensitive device, wherein the electrode layer is at least partially parallel with the photosensitive device, an insulating layer is disposed between the electrode layer and the photosensitive device, and the electrode layer is connected with a common electrode which is connected to a constant potential.

Optionally, the photosensitive device may further include an upper electrode layer, the upper electrode layer being connected with a first common electrode which is connected to a first constant potential, and the self-luminous device includes a top electrode layer, the top electrode layer being connected with a second common electrode which is connected to a second constant potential.

Optionally, a gate layer of the first TFT device may be disposed above the channel layer of the first TFT device, and the optical fingerprint sensing circuit may further include an electrode layer which is disposed at a same layer as the gate layer and below the photosensitive device, wherein the electrode layer is at least partially parallel with the photosensitive device, an insulating layer is disposed between the electrode layer and the photosensitive device, and the electrode layer is connected with a common electrode which is connected to a constant potential.

Optionally, the photosensitive device may further include an upper electrode layer, the upper electrode layer being connected with a first common electrode which is connected to a first constant potential, and the self-luminous device includes a top electrode layer, the top electrode layer being connected with a second common electrode which is connected to a second constant potential.

Optionally, a light blocking wall may be disposed between the self-luminous device and the photosensitive device.

Optionally, a light collimator layer may be disposed above the photosensitive device.

Optionally, light emitted from the self-luminous device may be reused by the photosensitive device for fingerprint imaging.

Optionally, a light blocking layer may be disposed on the photosensitive device over the channel layer of the first TFT device.

Embodiments of the present disclosure may provide following advantages. In embodiments of the present disclosure, a self-luminous device and an optical fingerprint sensing circuit are disposed in a same self-luminous display pixel, so that the self-luminous display pixel not only supports a display function, but also can acquire a fingerprint image based on optics theory. That is, the self-luminous display pixel can be also used in fingerprint image acquisition to realize a fingerprint recognition function. In this way, functions of the self-luminous display pixel may be strengthened to increase an integration level of the self-luminous display pixel. Besides, in the self-luminous display pixel, the channel layer of the first TFT device may be disposed right under a portion of the photosensitive device, so that light may be blocked by the photosensitive device and prevented from reaching the channel layer, to avoid a leakage of acquired fingerprint image signals.

Further, an electrode layer may be disposed at a same layer as the gate layer and below the photosensitive device, and an insulating layer may be disposed between the electrode layer and the photosensitive device, wherein the electrode layer is at least partially parallel with the photosensitive device. In this way, a capacitance is formed between the electrode layer and the photosensitive device to make an equivalent capacitance of the photosensitive device greater. As a result, the photosensitive device may store more charge signals, and a contrast of fingerprint images may be increased accordingly, which may improve quality of acquired fingerprint images.

Further, an upper electrode layer of the photosensitive device is connected with a first common electrode which is connected to a first constant potential, and a top electrode layer of the self-luminous device is connected with a second common electrode which is connected to a second constant potential. The upper electrode layer of the photosensitive device and the top electrode layer of the self-luminous device are connected to different constant potentials, to make the photosensitive device and the self-luminous device in a stable status respectively and result in fewer electronic noises.

Further, light emitted from the self-luminous device may be reused by the photosensitive device for fingerprint imaging. Therefore, it is unnecessary to provide a special light source to the optical fingerprint sensing circuit, which may save cost and simplify a structure.

Further, a light blocking wall may be disposed between the self-luminous device and the photosensitive device, to prevent light emitted from the self-luminous device from directly irradiating to the photosensitive device to avoid a saturated status of the photosensitive device, as the saturated status may make the photosensitive device not capable of absorbing optical signals of fingerprints.

Further, the photosensitive device may further include a lower electrode layer which is a light-blocking layer, and the channel layer of the first TFT device may be disposed right under a portion of the lower electrode layer. The lower electrode layer prevents light from entering the channel layer of the first TFT device, so as to further avoid a leakage of signals in the optical fingerprint sensing circuit.

DETAILED DESCRIPTION

As described in the background, functions and structures of existing self-luminous display pixels need to be improved.

Therefore, embodiments of the present disclosure provide a self-luminous display pixel. By disposing an optical fingerprint sensing circuit in the pixel, functions of the self-luminous display pixel may be strengthened, a structure of the self-luminous display pixel may be improved, and an integration level of the self-luminous display pixel may be increased.

In order to clarify the object, characteristic and advantages of embodiments of the present disclosure, embodiments of present disclosure will be described clearly in detail in conjunction with accompanying drawings.

Figure 1:
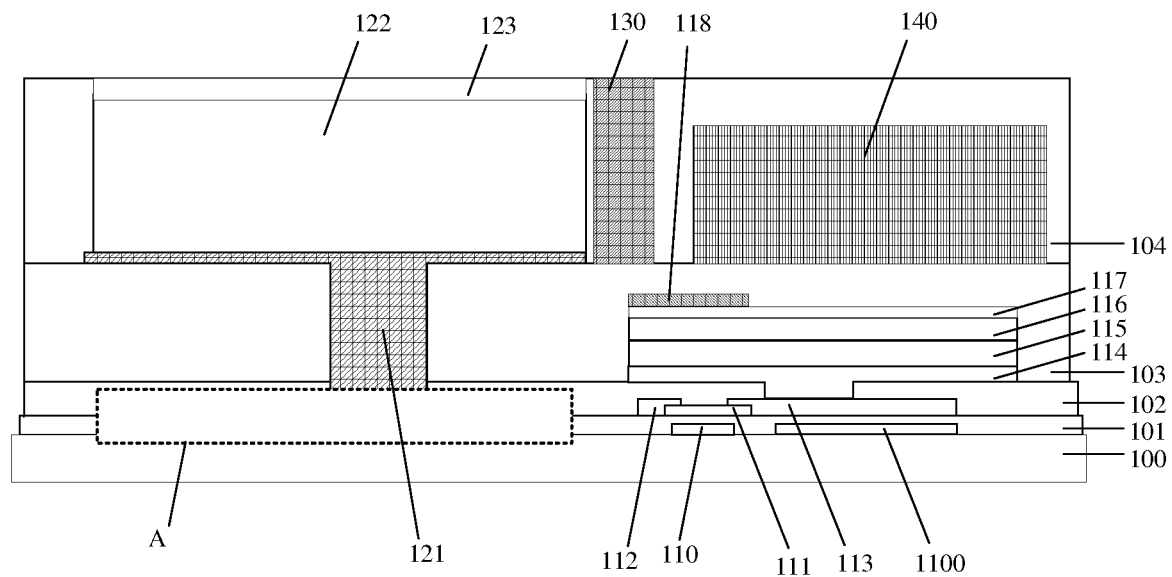
FIG. 1 schematically illustrates a sectional view of a self-luminous display pixel according to an embodiment.

In an embodiment, a self-luminous display pixel is provided. FIG. 1 schematically illustrates a sectional view of the self-luminous display pixel.

Referring to FIG. 1, the self-luminous display pixel includes a self-luminous circuit (not labeled in FIG. 1) on a substrate 100. The self-luminous circuit includes a self-luminous device (not labeled in FIG. 1) and TFT devices (not labeled in FIG. 1). The self-luminous device includes a bottom electrode layer 121, a self-luminous semiconductor layer 122 and a top electrode layer 123. The bottom electrode layer 121 is a light-blocking layer, and the TFT devices are disposed in a region enclosed by a dotted box A. The number of the TFT device may be one or more.

In some embodiments, the bottom electrode layer 121 may include a metal material which is generally light-blocking, so that the bottom electrode layer 121 is a light-blocking layer.

In some embodiments, the bottom electrode layer may include other light-blocking conductive materials.

In some embodiments, the self-luminous semiconductor layer 122 may include multiple layers. For example, the self-luminous semiconductor layer 122 may be an Organic Light-Emitting Diode (OLED) laminated layer which generally includes multiple layers, such as a hole injection layer, a light emitting layer and an electron injection layer.

Still referring to FIG. 1, the self-luminous display pixel may further include an optical fingerprint sensing circuit on the substrate 100 (not labeled in FIG. 1) which includes a first TFT device (not labeled in FIG. 1) and a photosensitive device (not labeled in FIG. 1). The first TFT device has a source (not labeled in FIG. 1), a drain (not labeled in FIG. 1), a gate layer 110 and a channel layer 111. The photosensitive device includes a photosensitive semiconductor layer (not labeled in FIG. 1). In some embodiments, the photosensitive semiconductor layer may be an inorganic PIN diode. Specifically, the photosensitive semiconductor layer may include a first semiconductor layer 116, a second semiconductor layer 115 and a third semiconductor layer 114 which are laminated from top to bottom. The photosensitive device further includes an upper electrode layer 117 on the photosensitive semiconductor layer. A light blocking layer 118 may be disposed on a portion of the upper electrode layer 117 and over the channel layer 111. That is, the light blocking layer 118 may be disposed on the photosensitive device over the channel layer 111 of the first TFT device.

In some embodiments, the source is a portion of a source layer 112 in FIG. 1. A portion of the source layer 112 which is closer to the channel layer 111 serves as the source, and the other portion of the source layer 112 serves as a conductive connection part, so that the first TFT device is electrically connected with other conductive structures not shown in FIG. 1 (such as data lines or scanning lines). The drain is a portion of a drain layer 113 in FIG. 1. A portion of the drain layer 113 which is closer to the channel layer 111 serves as the drain, and the other portion of the drain layer 113 serves as a lower electrode layer of the photosensitive device which is also called a drain connection layer below (not labeled in FIG. 1). The drain connection layer is connected with the third semiconductor layer 114 of the photosensitive device, so that the drain of the first TFT device is electrically connected with the photosensitive device. As described below, the drain connection layer is further used in generation of capacitance.

In some embodiments, the first semiconductor layer 116 may be a p-type silicon (p-Si) semiconductor layer, the second semiconductor layer 115 may be an i-type silicon (i-Si) semiconductor layer, and the third semiconductor layer 114 may be an n-type silicon (n-Si) semiconductor layer, that is, the three semiconductor layers form a PIN diode. In some embodiments, positions of the first semiconductor layer 116 and the third semiconductor layer 114 may be exchanged.

In some embodiments, the photosensitive semiconductor layer may be an inorganic PN diode. In some embodiments, the photosensitive semiconductor layer may be an organic PN diode or an organic PIN diode. If the photosensitive semiconductor layer is an inorganic PN diode or an inorganic PIN diode, the photosensitive semiconductor layer may be relatively thin. For example, thickness of the photosensitive semiconductor layer may be less than 0.5 μm. If the photosensitive semiconductor layer is an organic PN diode or an organic PIN diode, the photosensitive semiconductor layer may be relatively thick. For example, the thickness of the photosensitive semiconductor layer may be greater than 1 μm.

It should be noted that, although the self-luminous display pixel provided in the embodiment is disposed on the substrate 100, the substrate 100 does not normally belong to a self-luminous display pixel. A plurality of self-luminous display circuits provided in the embodiment and a plurality of existing optical fingerprint sensing circuits may be disposed on the substrate 100. The substrate 100, the self-luminous display pixel, and other structures may constitute a display panel.

Still referring to FIG. 1, the channel layer 111 of the first TFT device is disposed right under a portion of the photosensitive semiconductor layer, that is, a portion of the photosensitive semiconductor layer is disposed over the channel layer 111, or the channel layer 111 of the first TFT device is disposed right under the portion of the photosensitive device.

The channel layer 111 of the first TFT device is generally a semiconductor layer and is susceptible to light. When light irradiates to the channel layer 111, the channel layer 111 is caused to produce photoelectrons which cause the channel layer 111 to be in a connected state and thus fingerprint photoelectric signals temporarily stored in the photosensitive device generate a leakage. In the embodiment, the photosensitive semiconductor layer is capable of blocking at least a portion of light. By disposing the channel layer 111 right under the portion of the photosensitive semiconductor layer, light may be blocked by the portion of the light-sensitive semiconductor layer, thereby reducing the amount of light reaching the channel layer 111 and mitigating the signal leakage.

Still referring to FIG. 1, as described above, the light blocking layer 118 is disposed on the photosensitive device over the channel layer 111 of the first TFT device. Therefore, the channel layer 111 of the first TFT device is also disposed right under the portion of the light blocking layer 118. In some embodiments, the channel layer 111 of the first TFT device is further disposed right under the portion of the light blocking layer 118. In this way, the channel layer 111 of the first TFT device may be further shielded by the light blocking layer 118, to further prevent light from irradiating to the channel layer 111 of the first TFT device, which may avoid the above signal leakage.

In some embodiments, the channel layer 111 is disposed right under a portion of the light blocking layer 118. That is, a portion of the light blocking layer 118 covers the channel layer 111 of the first TFT device, or at least a portion of the light blocking layer 118 is disposed over the channel layer 111. In this way, an area of the light blocking layer 118 above the channel layer 111 (including right over the channel layer 111 and not right over the channel layer 111) may be set to be larger than an area of the channel layer 111, so as to ensure that a portion of the light blocking layer 118 is disposed over the channel layer 111, and a portion of the light blocking layer 118 is disposed above but not right over the channel layer 111. The portion of the light blocking layer 118 disposed above but not right over the channel layer 111 may further protect the channel layer 111 from light exposure to better avoid occurrence of the above signal leakage.

It should be noted that, although the photosensitive semiconductor layer disposed right under the light blocking layer 118 is difficult to be used to receive light and acquire a fingerprint image, the portion of the photosensitive semiconductor layer increases a total area of the entire photosensitive semiconductor layer, thereby increasing an equivalent capacitance of the photosensitive device. The greater the equivalent capacitance, the greater the amount of full well the photosensitive device can reach, and the greater the amount of charge the photosensitive device can temporarily store, i.e., the greater the amount of photoelectric signals the photosensitive device can temporarily store. In this way, the photosensitive device can temporarily store more charge information, a contrast of fingerprint image may be increased, and quality of the acquired fingerprint images may be improved.

Still referring to FIG. 1, the gate layer 110 of the first TFT device is disposed below the channel layer 111. The optical fingerprint sensing circuit further includes an electrode layer 1100 disposed at a same layer as the gate layer 110. The electrode layer 1100 is disposed below the photosensitive device. A first insulating layer 101 is disposed between the electrode layer 1100 and the drain layer 113 of the photosensitive device. The electrode layer 1100 is connected with a common electrode (not shown in FIG. 1) which is connected to a constant potential.

In some embodiments, the gate layer 110 is disposed below the channel layer 111, and thus the first TFT device is a bottom gate structure. During a manufacturing process, the gate layer 110 is formed and then the channel layer 111 is formed. In some embodiments, the first TFT device may be formed using an amorphous silicon TFT process or an Indium Gallium Zinc Oxide (IGZO) TFT process.

In some embodiments, the entire electrode layer 1100 is disposed right under the photosensitive device. Thus, the entire electrode layer 1100 faces the photosensitive device.

In other embodiments, only a portion of the electrode layer is disposed right under the photosensitive device, to ensure that the electrode layer at least partially faces the photosensitive device.

In some embodiments, the electrode layer 1100 may be at least partially parallel with the photosensitive device.

From above, the electrode layer 1100 faces the photosensitive device, and the electrode layer 1100 is at least partially parallel with the photosensitive device. However, when the electrode layer 1100 faces the photosensitive device, and is at least partially parallel with the photosensitive device, and there is an insulating layer between the electrode layer 1100 and the drain layer 113 of the photosensitive device, a capacitance is formed between the electrode layer 1100 and the photosensitive device. The capacitance makes an equivalent capacitance of the photosensitive device increase, and the greater the equivalent capacitance, the larger the full well can be reached by the photosensitive device, and the larger the amount of charges that the photosensitive device can temporarily store, that is, the greater the amount of photoelectric signals the photosensitive device can temporarily store. In this way, the photosensitive device can acquire more light information, a contrast of fingerprint images may be increased, and quality of the acquired fingerprint images may be improved.

It should be noted that, in the capacitance formed between the electrode layer 1100 and the photosensitive device, the upper electrode of the capacitance mainly includes the lower electrode layer of the photosensitive device, i.e., the drain connection layer. This is because, as described above, a portion of the drain layer 113 serves as the drain of the first TFT device, and the other portion of the drain layer 113 extends towards right which mainly functions as conductive connection. The other portion of the drain layer 113 serves as the lower electrode layer of the photosensitive device (i.e., the drain connection layer) for connecting to the third semiconductor layer 114 of the photosensitive device. In other words, the drain layer 113 includes the drain of the first TFT device and the lower electrode layer (i.e., the drain connection layer) of the photosensitive device. That is, the portion of the drain layer 113 connected with the first TFT device (the channel layer) is the drain of the first TFT device, and the portion of the drain layer 113 connected with the photosensitive device (the third semiconductor layer) is the lower electrode layer (i.e., the drain connection layer) of the photosensitive device.

In some embodiments, both the upper electrode layer 117 and the top electrode layer 123 are made of a light transmitting conductive material. The upper electrode layer 117 is connected with a first common electrode (not shown in FIG. 1), which is connected to the first constant potential. The top electrode layer 123 is connected with a second common electrode (not shown in FIG. 1) which is connected to the second constant potential. The top electrode layer 123 of the self-luminous device and the upper electrode layer 117 of the photosensitive device are connected to different constant potentials, respectively, to make the self-luminous device and the photosensitive device in a stable status and fewer electronic noises.

Still referring to FIG. 1, in the embodiment, the gate layer 110 is directly disposed on the upper surface of the substrate 100, thus the electrode layer 1100 is also directly disposed on the upper surface of the substrate 100. The gate layer 110 and the electrode layer 1100 may be formed using a same process at the same time, thereby saving process steps and saving cost.

Still referring to FIG. 1, the self-luminous display pixel includes the first insulating layer 101 which covers the substrate 100, the gate layer 110 and the electrode layer 1100. A portion of the first insulating layer 101 which is disposed between the gate layer 110 and the channel layer 111 serves as a gate dielectric layer of the first TFT device. A portion of the first insulating layer 101 which is disposed between the electrode layer 1100 and the drain layer 113 serves as an insulating layer of a capacitance (an insulating layer between two electrodes of the capacitance) formed by the electrode layer 1100 and the lower electrode layer (i.e., the drain connection layer) of the photosensitive device. The source layer 112, the drain layer 113 and the channel layer 111 are disposed on the first insulating layer 101.

Still referring to FIG. 1, the self-luminous display pixel includes a second insulating layer 102 which covers the source layer 112, the drain layer 113 and the channel layer 111. A portion of the third semiconductor layer 114 penetrates through the second insulating layer 102 to be electrically connected with the lower electrode layer (i.e., the drain connection layer) of the photosensitive device, that is, the third semiconductor layer 114 is connected with the drain layer 113 of the first TFT device. Besides, a portion of the third semiconductor layer 114 is disposed on an upper surface of the second insulating layer 102.

Still referring to FIG. 1, the self-luminous display pixel includes a third insulating layer 103 which is disposed on the second insulating layer 102 and covers the photosensitive semiconductor layer. In some embodiments, the third semiconductor layer 114 on the upper surface of the second insulating layer 102 is covered by the third insulating layer 103, and the second semiconductor layer 115, the first semiconductor layer 116, the upper electrode layer 117 and the light blocking layer 118 are covered by the third insulating layer 103. A portion of the bottom electrode layer 121 is directly disposed on the upper surface of the third insulating layer 103, and the other portion of the bottom electrode layer 121 penetrates through the third insulating layer 103 to be electrically connected with the TFT device of a corresponding self-luminous circuit. As described above, the region enclosed by the dotted box A in FIG. 1 denotes to a region where the TFT device of the self-luminous circuit is located.

In some embodiments, the third insulating layer 103 may be referred to as a protective layer which covers the photosensitive semiconductor layer, so that the third insulating layer 103 can protect the photosensitive semiconductor layer. It can be seen that the optical fingerprint sensing circuit is disposed below the protective layer 103.

Still referring to FIG. 1, the self-luminous display pixel has a fourth insulating layer 104 which is disposed on the third insulating layer 103 and covers the bottom electrode layer 121 on the third insulating layer 103. The fourth insulating layer 104 surrounds the self-luminous semiconductor layer 122 and the top electrode layer 123, and an upper surface of the fourth insulating layer 104 is substantially flush with an upper surface of the top electrode layer 123 (in other embodiments, the upper surface of the fourth insulating layer 104 may be higher than the upper surface of the top electrode layer 123). That is, a sidewall of the self-luminous semiconductor layer 122 is covered by the fourth insulating layer 104.

In some embodiments, a material of each insulating layer may be silicon oxide, silicon nitride or a combination thereof, or may be other materials.

In some embodiments, a portion of the third semiconductor layer 114 penetrates through the second insulating layer 102, a portion of the third semiconductor layer 114 is disposed on the upper surface of the second insulating layer 102, and a top view area of the portion of the third semiconductor layer 114 on the upper surface of the second insulating layer 102 is larger than a top view area of the portion of the third semiconductor layer 114 penetrating through the second insulating layer 102. As shown in FIG. 1, width of the portion of the third semiconductor layer 114 on the upper surface of the second insulating layer 102 is greater than width of the portion of the third semiconductor layer 114 penetrating through the second insulating layer 102. An area of the second semiconductor layer 115 and an area of the first semiconductor layer 116 are generally equal to an area of the portion of the third semiconductor layer 114 on the upper surface of the second insulating layer 102. With this structure, the overall area of the photosensitive semiconductor layer is larger than the area of the portion of the third semiconductor layer 114 disposed in the second insulating layer 102, so that the photosensitive semiconductor layer has a relatively large area to receive light, which is advantageous for obtaining fingerprint images with a higher resolution.

Still referring to FIG. 1, a light collimator layer 140 may be disposed above the photosensitive device. In the embodiment, the light collimating layer 140 is disposed on the upper surface of the third insulating layer 103 and covered by the fourth insulating layer 104. The light collimating layer 140 absorbs at least a portion of light propagating from obliquely upward and allows light in a right angle or in an approximate right angle (an angle difference is less than 10 degrees) to penetrate through the light collimating layer 140 to enter the photosensitive device. The light collimating layer 140 may include light blocking regions and light-transmitting regions arranged at intervals. The light transmitting regions allow light to be transmitted in an up-to-down direction, and its section has an elongated bar shape. That is, the light collimator layer 140 includes the light blocking regions (for example, light blocking frames) and the light transmitting regions (for example, light transmitting holes). As the light transmitting regions are elongated, and periphery of the light transmitting regions are the light blocking regions, when light irradiates into the light collimator layer 140, the light blocking regions may block and absorb a great amount of light deviating the vertical direction, and only light propagating in a right angle or an approximate right angle (an angle difference is less than 10 degrees) is allowed to penetrate through the light collimator layer 140, so that the light collimator layer 140 can achieve a light collimator function.

Still referring to FIG. 1, a light blocking wall 130 may be provided between the self-luminous device and the photosensitive device. Specifically, the light blocking wall 130 is disposed in the fourth insulating layer 104, at a right side of the self-luminous semiconductor layer 122 and the top electrode layer 123 (also at the right side of the bottom electrode layer 121 on the third insulating layer), and at a left side of the light collimating layer 140. In some embodiments, height of the light blocking wall 130 is substantially equal to thickness of the fourth insulating layer 104.

In the embodiments, the light blocking wall 130 is disposed between the photosensitive member and the self-luminous device to prevent light emitted from the self-luminous device from directly irradiating the photosensitive device to cause the photosensitive device in a signal saturated status. The photosensitive device in the signal saturated status may make the photosensitive device not capable of absorbing optical signals of a fingerprint. Besides, the light blocking wall 130 is disposed upwards to the upper left of the channel layer 111 to block light and prevent light from entering the channel layer 111.

In the self-luminous display pixel provided in the embodiments, light emitted from the self-luminous device may be reused by the photosensitive device for fingerprint imaging. Therefore, it is unnecessary to provide a special light source to the optical fingerprint sensing circuit, which may save cost and simplify a structure. In the structure, the light blocking wall is disposed between the photosensitive device and the self-luminous device to prevent light emitted from the self-luminous device from reaching the photosensitive device before reaching a contact interface, where the contact interface denotes to an interface defined by a surface pressed by a fingerprint and the fingerprint.

In the self-luminous display pixel provided in the embodiments, the self-luminous device and the optical fingerprint sensing circuit are disposed in the same self-luminous display pixel, so that the self-luminous display pixel not only supports a display function, but also can acquire a fingerprint image using optics theory. That is, the self-luminous display pixel can be also used in fingerprint image acquisition to realize a fingerprint recognition function. In this way, functions of the self-luminous display pixel may be strengthened to increase an integration level of the self-luminous display pixel. Besides, in the self-luminous display pixel, the channel layer 111 of the first TFT device may be disposed right under a portion of the photosensitive semiconductor layer, so that light may be blocked by the photosensitive semiconductor layer and prevented from reaching the channel layer 111, to avoid a leakage of acquired fingerprint image signals.

Further, the channel layer 111 of the first TFT device may be disposed right under the light blocking layer 118. The light blocking layer 118 further shields the channel layer 111 of the first TFT device to further prevent light from irradiating to the channel layer 111 of the first TFT device. Besides, the portion of the photosensitive semiconductor layer right under the light blocking layer 118 increases a total area of the entire photosensitive semiconductor layer, thereby increasing an equivalent capacitance of the photosensitive device. Therefore, the photosensitive device can temporarily store more charge information, a contrast of fingerprint images may be increased, and quality of acquired fingerprint images may be improved.

Further, the electrode layer 1100 may be disposed at a same layer as the gate layer 110 and below the photosensitive device, and the insulating layer 101 may be disposed between the electrode layer 1100 and the photosensitive device, wherein the electrode layer 1100 is at least partially parallel with the photosensitive device. In this way, a capacitance is formed between the electrode layer 1100 and the photosensitive device to make an equivalent capacitance of the photosensitive device greater. As a result, the photosensitive device may store more charge signals, and a contrast of fingerprint images may be increased accordingly, which may improve quality of acquired fingerprint images.

Further, the upper electrode layer 117 of the photosensitive device is connected with the first common electrode which is connected to the first constant potential, and the top electrode layer 123 of the self-luminous device is connected with the second common electrode which is connected to the second constant potential. The top electrode layer 123 of the self-luminous device and the upper electrode layer 117 of the photosensitive device are connected to different constant potentials, to make the photosensitive device and the self-luminous device in a stable status respectively and result in fewer electronic noises.

Further, light emitted from the self-luminous device may be reused by the photosensitive device for fingerprint imaging. Therefore, it is unnecessary to provide a special light source to the optical fingerprint sensing circuit, which may save cost and simplify a structure.

Figure 2:
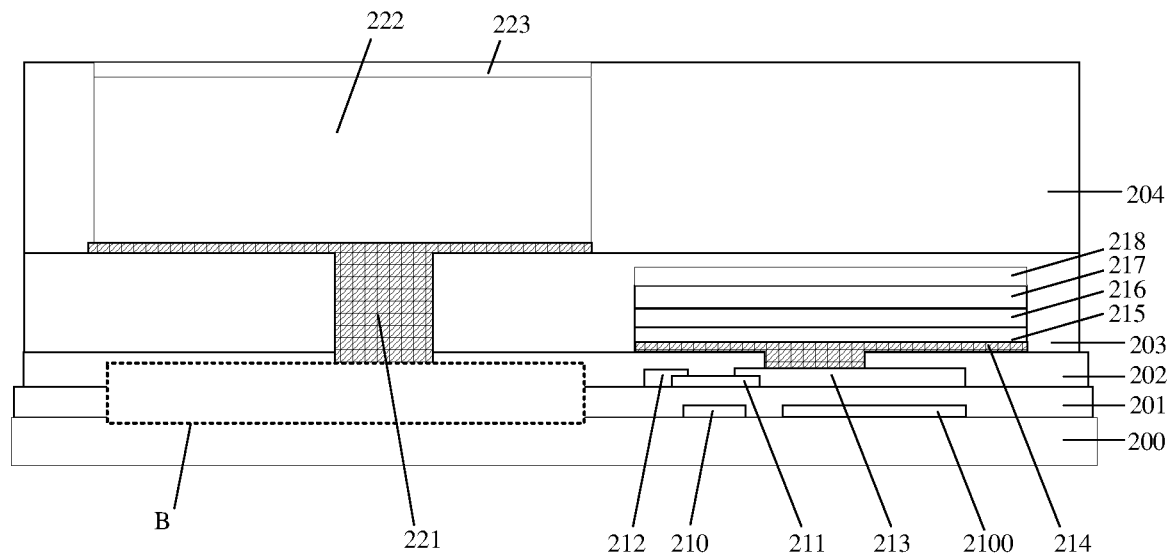
FIG. 2 schematically illustrates a sectional view of a self-luminous display pixel according to an embodiment.

In an embodiment, another self-luminous display pixel is provided. FIG. 2 schematically illustrates a sectional view of the self-luminous display pixel.

Referring to FIG. 2, the self-luminous display pixel includes a self-luminous circuit (not labeled in FIG. 2) on a substrate 200. The self-luminous circuit includes a self-luminous device (not labeled in FIG. 2) and TFT devices (not labeled in FIG. 2). The self-luminous device includes a bottom electrode layer 221, a self-luminous semiconductor layer 222 and a top electrode layer 223. The bottom electrode layer 221 is a light-blocking layer, and the TFT devices are disposed in a region enclosed by a dotted box B. The number of the TFT device may be one or more.

Still referring to FIG. 2, the self-luminous display pixel may further include an optical fingerprint sensing circuit on the substrate 200 (not labeled in FIG. 2) which includes a first TFT device (not labeled in FIG. 2) and a photosensitive device (not labeled in FIG. 2). The first TFT device has a source (not labeled in FIG. 2), a drain (not labeled in FIG. 2), a gate layer 210 and a channel layer 211. The photosensitive device includes a photosensitive semiconductor layer (not labeled in FIG. 2). In some embodiments, the photosensitive semiconductor layer may be an inorganic PIN diode. Specifically, the photosensitive semiconductor layer may include a first semiconductor layer 217, a second semiconductor layer 216 and a third semiconductor layer 215 which are laminated from top to bottom. The photosensitive device further includes an upper electrode layer 218 on the photosensitive semiconductor layer, and a lower electrode layer 214 under the photosensitive semiconductor layer.

In some embodiments, the source is a portion of a source layer 212 in FIG. 2. A portion of the source layer 212 which is closer to the channel layer 211 serves as the source, and the other portion of the source layer 212 serves as a conductive connection part, so that the first TFT device is electrically connected with other conductive structures not shown in FIG. 2 (such as data lines or scanning lines). The drain is a portion of a drain layer 213 in FIG. 2. A portion of the drain layer 213 which is closer to the channel layer 211 serves as the drain, and the other portion of the drain layer 213 serves as a drain connection layer (not labeled in FIG. 2). The drain connection layer is connected with the lower electrode layer 214 of the photosensitive device, so that the drain of the first TFT device is electrically connected with the photosensitive device. As described below, the drain connection layer of the drain layer 213 is further used in generation of capacitance.

Still referring to FIG. 2, the channel layer 211 of the first TFT device is disposed right under a portion of the photosensitive semiconductor layer, that is, a portion of the photosensitive semiconductor layer is disposed over the channel layer 211. The channel layer 211 of the first TFT device is generally a semiconductor layer and is susceptible to light. When light irradiates to the channel layer 211, the channel layer 211 is caused to produce photoelectrons which cause the channel layer 211 to be in a connected state and thus fingerprint photoelectric signals temporarily stored in the photosensitive device generate a leakage. In the embodiment, the photosensitive semiconductor layer is capable of blocking at least a portion of light. By disposing the channel layer 211 right under the portion of the photosensitive semiconductor layer, light may be blocked by the portion of the light-sensitive semiconductor layer, thereby reducing the amount of light reaching the channel layer 211 and mitigating the signal leakage.

In the embodiment, the channel layer 211 of the first TFT device is also disposed right under a portion of the lower electrode layer 214 which is a light-blocking layer. In this way, the lower electrode layer 214 prevents light from entering the channel layer 211, to further avoid a signal leakage in the optical fingerprint sensing circuit.

Still referring to FIG. 2, the gate layer 210 of the first TFT device is disposed below the channel layer 211. The optical fingerprint sensing circuit further includes an electrode layer 2100 disposed at a same layer as the gate layer 210. The electrode layer 2100 is disposed below the photosensitive device. A first insulating layer 201 is disposed between the electrode layer 2100 and the drain layer 213 of the photosensitive device. The electrode layer 2100 is connected with a common electrode (not shown in FIG. 2) which is connected to a constant potential.

In some embodiments, the gate layer 210 is disposed below the channel layer 211, and thus the first TFT device is a bottom gate structure.

In some embodiments, the entire electrode layer 2100 is disposed right under the photosensitive device. Thus, the entire electrode layer 2100 faces the photosensitive device.

In other embodiments, only a portion of the electrode layer is disposed right under the photosensitive device, to ensure that the electrode layer at least partially faces the photosensitive device.

In some embodiments, the electrode layer 2100 may be at least partially parallel with the photosensitive device.

From above, the electrode layer 2100 faces the photosensitive device, and the electrode layer 2100 is at least partially parallel with the photosensitive device. However, when the electrode layer 2100 faces the photosensitive device, and is at least partially parallel with the photosensitive device, and there is an insulating layer between the electrode layer 2100 and the drain layer 213 of the photosensitive device, a capacitance is formed between the electrode layer 2100 and the photosensitive device. The capacitance makes an equivalent capacitance of the photosensitive device increase, and the greater the equivalent capacitance, the larger the full well can be reached by the photosensitive device, and the larger the amount of charges that the photosensitive device can temporarily store, that is, the greater the amount of photoelectric signals the photosensitive device can temporarily store. In this way, the photosensitive device can acquire more light signals, a contrast of fingerprint images may be increased, and quality of the acquired fingerprint images may be improved.

It should be noted that, in the capacitance formed between the electrode layer 2100 and the photosensitive device, the upper electrode of the capacitance mainly includes the drain connection layer. This is because, as described above, a portion of the drain layer 213 serves as the drain of the first TFT device, and the other portion of the drain layer 213 extends towards right. The other portion of the drain layer 213 functioning as conductive connection is connected to the lower electrode layer 214 of the photosensitive device. In other words, the drain layer 213 includes the drain connection layer. The portion of the drain layer 213 connected with the first TFT device (the channel layer) is the drain of the first TFT device, and the portion of the drain layer 213 connected with the lower electrode layer 214 is the drain connection layer.

In some embodiments, both the upper electrode layer 218 and the top electrode layer 223 are made of a light transmitting conductive material. The upper electrode layer 218 is connected with a first common electrode (not shown in FIG. 2), which is connected to the first constant potential. The top electrode layer 223 is connected with a second common electrode (not shown in FIG. 2) which is connected to the second constant potential. The top electrode layer 223 of the self-luminous device and the upper electrode layer 218 of the photosensitive device are connected to different constant potentials, respectively, to make the self-luminous device and the photosensitive device in a stable status and fewer electronic noises.

Still referring to FIG. 2, in the embodiment, the gate layer 210 is directly disposed on the upper surface of the substrate 200, thus the electrode layer 2100 is also directly disposed on the upper surface of the substrate 200. The gate layer 210 and the electrode layer 2100 may be formed using a same process at the same time, thereby saving process steps and saving cost.

Still referring to FIG. 2, the self-luminous display pixel includes the first insulating layer 201 which covers the substrate 200, the gate layer 210 and the electrode layer 2100. A portion of the first insulating layer 201 which is disposed between the gate layer 210 and the channel layer 211 serves as a gate dielectric layer of the first TFT device. A portion of the first insulating layer 201 which is disposed between the electrode layer 2100 and the drain layer 213 serves as an insulating layer of a capacitance (an insulating layer between two electrodes of the capacitance) formed by the electrode layer 2100 and the photosensitive device. The source layer 212, the drain layer 213 and the channel layer 211 are disposed on the first insulating layer 201.

Still referring to FIG. 2, the self-luminous display pixel includes a second insulating layer 202 which covers the source layer 212, the drain layer 213 and the channel layer 211. A portion of the lower electrode layer 214 penetrates through the second insulating layer 202 to be electrically connected with the drain connection layer, that is, the lower electrode layer 214 is connected with the drain layer 213 of the first TFT device. Besides, a portion of the lower electrode layer 214 is disposed on an upper surface of the second insulating layer 202.

In some embodiments, a portion of the lower electrode layer 214 penetrates through the second insulating layer 202, a portion of the lower electrode layer 214 is disposed on the upper surface of the second insulating layer 202, and a top view area of the portion of the lower electrode layer 214 on the upper surface of the second insulating layer 202 is larger than a top view area of the portion of the lower electrode layer 214 penetrating through the second insulating layer 202. As shown in FIG. 2, width of the portion of the lower electrode layer 214 on the upper surface of the second insulating layer 202 is greater than width of the portion of the lower electrode layer 214 penetrating through the second insulating layer 202. This structure ensures a total top view area of the photosensitive semiconductor layer is larger than a top view area of the lower electrode layer 214 in the second insulating layer 202. An area of the third semiconductor layer 215, an area of the second semiconductor layer 216 and an area of the first semiconductor layer 217 are generally equal to an area of the portion of the lower electrode layer 214 on the upper surface of the second insulating layer 202. With this structure, the overall area of the photosensitive semiconductor layer is larger than the area of the portion of the lower electrode layer 214 disposed in the second insulating layer 202, so that the photosensitive semiconductor layer has a relatively large area to receive light, which is advantageous for obtaining fingerprint images with a higher resolution.

Still referring to FIG. 2, the self-luminous display pixel includes a third insulating layer 203 which is disposed on the second insulating layer 202 and covers the photosensitive semiconductor layer. In some embodiments, the lower electrode layer 214 on the upper surface of the second insulating layer 202 is covered by the third insulating layer 203, and the third semiconductor layer 215, the second semiconductor layer 216, the first semiconductor layer 217 and the upper electrode layer 218 are covered by the third insulating layer 203. A portion of the bottom electrode layer 221 is directly disposed on the upper surface of the third insulating layer 203, and the other portion of the bottom electrode layer 221 penetrates through the third insulating layer 203 to be electrically connected with the TFT device of a corresponding self-luminous circuit. As described above, the region enclosed by the dotted box B in FIG. 2 denotes to a region where the TFT device of the self-luminous circuit is located.

In some embodiments, the third insulating layer 203 may be referred to as a protective layer which covers the photosensitive semiconductor layer, so that the third insulating layer 203 can protect the photosensitive semiconductor layer. It can be seen that the optical fingerprint sensing circuit is disposed below the protective layer 203.

Still referring to FIG. 2, the self-luminous display pixel has a fourth insulating layer 204 which is disposed on the third insulating layer 203 and covers the bottom electrode layer 221 on the third insulating layer 203. The fourth insulating layer 204 surrounds the self-luminous semiconductor layer 222 and the top electrode layer 223, and an upper surface of the fourth insulating layer 204 is substantially flush with an upper surface of the top electrode layer 223 (in other embodiments, the upper surface of the fourth insulating layer 204 may be higher than the upper surface of the top electrode layer 223). That is, a sidewall of the self-luminous semiconductor layer 222 is covered by the fourth insulating layer 204.

In the self-luminous display pixel provided in the embodiment, the channel layer 211 of the first TFT device is also disposed right under a portion of the lower electrode layer 214 which is a light-blocking layer. In this way, the lower electrode layer 214 prevents light from entering the channel layer 211, to further avoid a leakage of acquired fingerprint image signals.

More details about structures, properties and advantages of the self-luminous display pixel can be found in the above descriptions of the foregoing embodiment.

Figure 3:
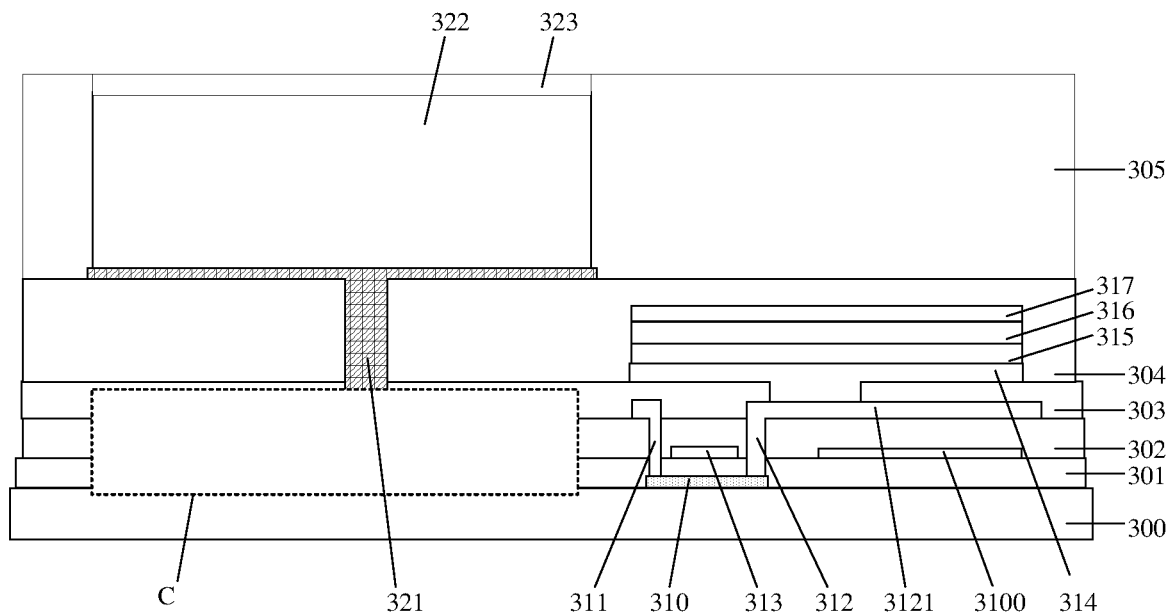
FIG. 3 schematically illustrates a sectional view of a self-luminous display pixel according to an embodiment.

In an embodiment, another self-luminous display pixel is provided. FIG. 3 schematically illustrates a sectional view of the self-luminous display pixel.

Referring to FIG. 3, the self-luminous display pixel includes a self-luminous circuit (not labeled in FIG. 3) on a substrate 300. The self-luminous circuit includes a self-luminous device (not labeled in FIG. 3) and TFT devices (not labeled in FIG. 3). The self-luminous device includes a bottom electrode layer 321, a self-luminous semiconductor layer 322 and a top electrode layer 323. The bottom electrode layer 321 is a light-blocking layer, and the TFT devices are disposed in a region enclosed by a dotted box C. The number of the TFT device may be one or more.

Still referring to FIG. 3, the self-luminous display pixel may further include an optical fingerprint sensing circuit on the substrate 300 (not labeled in FIG. 3) which includes a first TFT device (not labeled in FIG. 3) and a photosensitive device (not labeled in FIG. 3). The first TFT device has a source (not labeled in FIG. 3), a drain (not labeled in FIG. 3), a gate layer 313 and a channel layer 310. The source is a portion of a source layer 311, and the drain is a portion of a drain layer 312. The photosensitive device includes a photosensitive semiconductor layer (not labeled in FIG. 3). In some embodiments, the photosensitive semiconductor layer may be an inorganic PIN diode. Specifically, the photosensitive semiconductor layer may include a first semiconductor layer 316, a second semiconductor layer 315 and a third semiconductor layer 314. The photosensitive device further includes an upper electrode layer 317 on an upper surface of the photosensitive semiconductor layer.

Still referring to FIG. 3, the channel layer 310 of the first TFT device is disposed right under a portion of the photosensitive semiconductor layer.

By disposing the channel layer 310 right under a portion of the photosensitive semiconductor layer, the channel layer 310 of the first TFT device may be shielded by the photosensitive semiconductor layer, to prevent light from reaching the channel layer 310, which may avoid a signal leakage in the photosensitive device. Besides, by employing the photosensitive semiconductor layer in the photosensitive device to protect the channel layer 310 from light irradiation, no extra structure is required, thereby saving process steps and cost.

In some embodiments, the channel layer 310 is disposed right under a portion of the photosensitive semiconductor layer, that is, a portion of the photosensitive semiconductor layer is obscured over the channel layer 310 of the first TFT device, or at least a portion of the photosensitive semiconductor layer is disposed over the channel layer 310. An area of the photosensitive semiconductor layer disposed above the channel layer 310 (including right over the channel layer 310 and not right over the channel layer 310) may be set larger than an area of the channel layer 310, so as to ensure that a portion of the photosensitive semiconductor layer is disposed over the channel layer 310, and the other portion of the photosensitive semiconductor layer is disposed above but not right over the channel layer 310. The other portion of the photosensitive semiconductor layer disposed above but not right over the channel layer 310 may further protect the channel layer 310 from light exposure, thereby better avoiding occurrence of a signal leakage.

In some embodiments, the gate layer 313 of the first TFT is disposed above the channel layer 310, and the gate layer 313 has certain light blocking property. Therefore, it is possible to use the gate layer 313 to prevent light from irradiating to the channel layer 310 of the first TFT device. In some embodiments, the channel layer 310 of the first TFT device is disposed right under a portion of the photosensitive semiconductor layer.

Still referring to FIG. 3, the gate layer 313 of the first TFT device is disposed above the channel layer 310, with a first insulating layer 301 therebetween. A second insulating layer 302 is disposed on the first insulating layer 301. A portion of the drain layer 312 penetrates through the first insulating layer 301 and the second insulating layer 302, and a portion of the drain layer 312 is disposed on an upper surface of the second insulating layer 302. The portion of the drain layer 312 on the upper surface of the second insulating layer 302 is further labeled as a drain connection layer 3121 in FIG. 3, i.e., the drain connection layer 3121 is the portion of the drain layer 312 disposed on the upper surface of the second insulating layer 302. In the present embodiment, the drain connection layer 3121 is also a lower electrode layer of the photosensitive device for connecting the third semiconductor layer 314 of the photosensitive device.

In the embodiments, the gate layer 313 of the first TFT device is disposed above the channel layer 310, thus the first TFT device is a top gate structure. During a manufacturing process, the channel layer 310 is formed, and then the gate layer 313 is formed. In some embodiments, the first TFT device may be formed using a low-temperature polysilicon TFT process or a high-temperature polysilicon TFT process.

Still referring to FIG. 3, the optical fingerprint sensing circuit further includes an electrode layer 3100 disposed at a same layer as the gate layer 313. The electrode layer 3100 is disposed below the photosensitive device. The second insulating layer 302 is disposed between the electrode layer 3100 and the drain connection layer 3121. The electrode layer 3100 is connected with a common electrode (not shown in FIG. 3) which is connected to a constant potential.

In some embodiments, the electrode layer 3100 is disposed right under the photosensitive device. Thus, the entire electrode layer 3100 faces the photosensitive semiconductor layer of the photosensitive device. Besides, the electrode layer 3100 is at least partially parallel with the third semiconductor layer 314 of the photosensitive device. When the electrode layer at least partially faces the third semiconductor layer 314 of the photosensitive device, and an insulating layer is disposed between the electrode layer 3100 and the third semiconductor layer 314 of the photosensitive device, a capacitance is formed between the electrode layer 3100 and the third semiconductor layer 314 of the photosensitive device. The capacitance makes an equivalent capacitance of the photosensitive device increase. The greater the equivalent capacitance, the greater the amount of full well the photosensitive device can reach, and the greater the amount of charges the photosensitive device can temporarily store, i.e., the greater the amount of photoelectric signals the photosensitive device can temporarily store. In this way, the photosensitive device can temporarily store more charge signals, a contrast of fingerprint image may be increased, and quality of the acquired fingerprint images may be improved.

In the capacitance formed between the electrode layer 3100 and the third semiconductor layer 314, an upper electrode of the capacitance is mainly the structure of the photosensitive device (this part is also a portion which is desired as the upper electrode and includes the third semiconductor layer 314), but also includes a portion of the drain connection layer 3121 (as the drain connection layer 3121 is electrically connected with the third semiconductor layer 314 of the photosensitive device, and the drain connection layer 3121 is also at least partially over the electrode layer 3100).

In some embodiments, the channel layer 310 is disposed directly on a portion of an upper surface of the substrate 300. The first insulating layer 301 covers the channel layer 310 and other portions of the upper surface of the substrate 300. The gate layer 313 and the electrode layer 3100 are disposed on an upper surface of the first insulating layer 301.

In some embodiments, both the upper electrode layer 317 and the top electrode layer 323 are made of a light-transmitting conductive material. The upper electrode layer 317 is connected with a first common electrode (not shown in FIG. 3) which is connected to the first constant potential, and the top electrode layer 323 is connected with a second common electrode (not shown in FIG. 3) which is connected to the second constant potential. The top electrode layer 323 of the self-luminous device and the upper electrode layer 317 of the photosensitive device are connected to different constant potentials, respectively, to ensure that the self-luminous device and the photosensitive device to be in a stable status.

Still referring to FIG. 3, the self-luminous display pixel includes the first insulating layer 301 which covers the substrate 300 and the channel layer 310. A portion of the first insulating layer 301 between the channel layer 310 and the gate layer 313 serves as a gate dielectric layer of the first TFT device.

Still referring to FIG. 3, the self-luminous display pixel includes the second insulating layer 302 which covers the gate layer 313 and the electrode layer 3100. A portion of the second insulating layer 302 between the electrode layer 3100 and the drain connection layer 3121 serves as an insulating layer of the capacitance formed by the electrode layer 3100 and the photosensitive device. A portion of the source layer 311 penetrates through the first insulating layer 301 and the second insulating layer 302, and a portion of the source layer 311 is disposed on the upper surface of the second insulating layer 302. Similarly, a portion of the drain layer 312 penetrates through the first insulating layer 301 and the second insulating layer 302, and a portion of the drain layer 312 is disposed on the upper surface of the second insulating layer 302 (which is the drain connecting layer 3121).

Still referring to FIG. 3, the self-luminous display pixel includes a third insulating layer 303 which is disposed on the second insulating layer 302. A portion of the third semiconductor layer 314 penetrates through the third insulating layer 303 to be electrically connected with the drain connection layer 3121. Besides, a portion of the third semiconductor layer 314 is disposed on the upper surface of the third insulating layer 303.

In some embodiments, the third insulating layer 303 may be referred to as a TFT protective layer, that is, the self-luminous display pixel further includes a TFT protective layer. It can be seen that the first TFT device was covered by the TFT protective layer, and both the photosensitive semiconductor layer and the self-luminous semiconductor layer 322 are disposed above the upper surface of the TFT protective layer. In other embodiments, the photosensitive semiconductor layer and the self-luminous semiconductor layer may be disposed above the TFT protective layer, and other structures may be disposed therebetween.

Still referring to FIG. 3, the self-luminous display pixel includes a fourth insulating layer 304 which covers the photosensitive semiconductor layer. In some embodiments, the third semiconductor layer 314 on the upper surface of the third insulating layer 303 is covered by the fourth insulating layer 304, and the second semiconductor layer 315, the first semiconductor layer 316 and the upper electrode layer 317 are also covered by the fourth insulating layer 304. A portion of the bottom electrode layer 321 is directly disposed on the upper surface of the fourth insulating layer 304, and the other portion of the bottom electrode layer 321 penetrates through the fourth insulating layer 304 to be electrically connected with the TFT device in a corresponding self-luminous circuit. As described above, the region enclosed by the dotted box C in FIG. 3 denotes to a region where the TFT devices of the self-luminous circuit are located.

Still referring to FIG. 3, the self-luminous display pixel includes a fifth insulating layer 305 which is disposed on the fourth insulating layer 304. The fifth insulating layer 304 covers the bottom electrode layer 321 on the fourth insulating layer 304, and surrounds the self-luminous semiconductor layer 322 and the top electrode layer 323. An upper surface of the fifth insulating layer 305 is substantially flush with an upper surface of the top electrode layer 323 (in other embodiments, the upper surface of the fifth insulating layer may be higher than that of the top electrode layer).

Still referring to FIG. 3, the self-luminous display pixel includes a fifth insulating layer 305 which is disposed on the fourth insulating layer 304. The fifth insulating layer 305 covers the bottom electrode layer 321 on the fourth insulating layer 304, and surrounds the self-luminous semiconductor layer 322 and the top electrode layer 323. An upper surface of the fifth insulating layer 305 is substantially flush with an upper surface of the top electrode layer 323 (in other embodiments, the upper surface of the fifth insulating layer may be higher than that of the top electrode layer).

In some embodiments, a portion of the third semiconductor layer 314 penetrates through the third insulating layer 303, and a portion of the third semiconductor layer 314 is disposed on the upper surface of the third insulating layer 303. A top view area of the portion of the third semiconductor layer 314 disposed on the upper surface of the third insulating layer 303 is larger than a top view area of the portion of the third semiconductor layer 314 penetrating through the third insulating layer 303. As shown in FIG. 3, width of the portion of the third semiconductor layer 314 on the upper surface of the third insulating layer 303 is greater than width of the portion of the third semiconductor layer 314 penetrating through the third insulating layer 303. This structure ensures that an overall top view area of the photosensitive semiconductor layer is larger than a top view area of the third semiconductor layer 314 in the third insulating layer 303.

It should be noted that, in some embodiments, a light blocking wall may be disposed between the self-luminous device and the photosensitive device. Further, a light collimating layer may be disposed above the photosensitive device. In some embodiment, the light collimator layer may be disposed above the photosensitive device right under the bottom electrode layer 321.

More details about structures, properties and advantages of the self-luminous display pixel can be found in the above descriptions of the foregoing embodiments.

Figure 4:
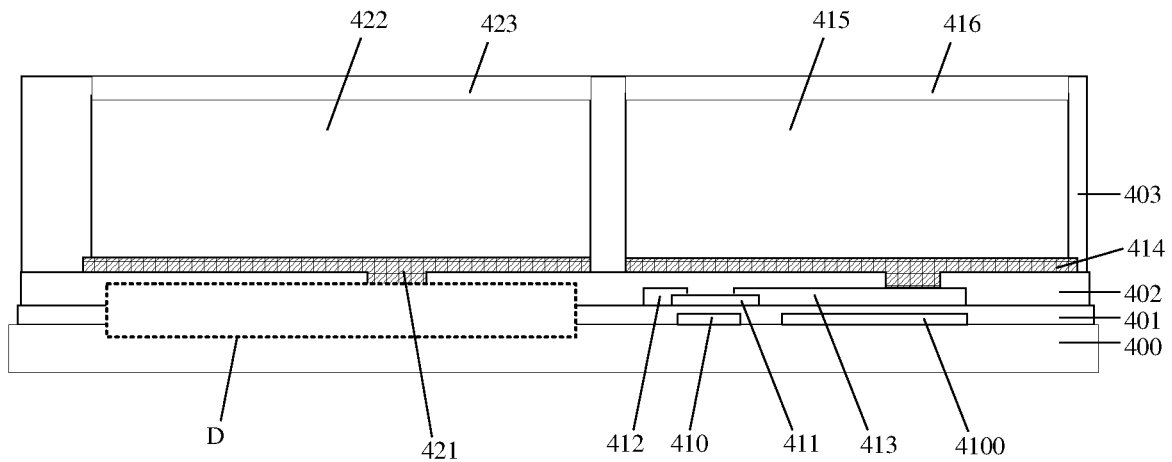
FIG. 4 schematically illustrates a sectional view of a self-luminous display pixel according to an embodiment.

In an embodiment, another self-luminous display pixel is provided. FIG. 4 schematically illustrates a sectional view of the self-luminous display pixel.

Referring to FIG. 4, the self-luminous display pixel includes a self-luminous circuit (not labeled in FIG. 4) on a substrate 400. The self-luminous circuit includes a self-luminous device (not labeled in FIG. 4) and TFT devices (not labeled in FIG. 4). The self-luminous device includes a bottom electrode layer 421, a self-luminous semiconductor layer 422 and a top electrode layer 423. The bottom electrode layer 421 is a light-blocking layer, and the TFT devices are disposed in a region enclosed by a dotted box D. The number of the TFT devices may be one or more.

In some embodiments, the self-luminous semiconductor layer 422 may include multiple layers. For example, the self-luminous semiconductor layer 422 may be an OLED laminated layer which generally includes multiple layers, such as a hole injection layer, a light emitting layer and an electron injection layer.

Still referring to FIG. 4, the self-luminous display pixel may further include an optical fingerprint sensing circuit on the substrate 400 (not labeled in FIG. 4) which includes a first TFT device (not labeled in FIG. 4) and a photosensitive device (not labeled in FIG. 4). The first TFT device has a source (not labeled in FIG. 4), a drain (not labeled in FIG. 4), a gate layer 410 and a channel layer 411. The source is a portion of a source layer 412, and the drain is a portion of a drain layer 413. The photosensitive device includes a photosensitive semiconductor layer 415. The photosensitive device further includes an upper electrode layer 416 on the photosensitive semiconductor layer 415, and a lower electrode layer 414 under the photosensitive semiconductor layer 415.

In some embodiments, the lower electrode layer 414 is also a light-blocking layer, and may include a metal material.

In some embodiments, the photosensitive semiconductor layer 415 is a semiconductor laminated layer including an organic photosensitive layer. When the self-luminous semiconductor layer 422 is an OLED laminated layer, the self-luminous semiconductor layer 422 is a semiconductor laminated layer including an organic light emitting layer. Besides, the photosensitive semiconductor layer 415 may be disposed at a same layer as the self-luminous semiconductor layer 422, i.e., they are disposed at a same level of height.

When the photosensitive semiconductor layer 415 is at the same layer as the self-luminous semiconductor layer 422, the upper surface of the lower electrode layer 414 and the upper surface of the bottom electrode layer 421 are disposed at a same level of height. Thus, the lower electrode layer 414 and the bottom electrode layer 421 may be manufactured simultaneously using a same process, thereby saving process steps and cost. In addition, some layer structures of the photosensitive semiconductor layer 415 and the self-luminous semiconductor layer 422 may be simultaneously formed in a same process, thereby saving process steps and cost.

In some embodiments, when the photosensitive semiconductor layer is disposed at a same layer as the self-luminous semiconductor layer, the photosensitive semiconductor layer may be an inorganic semiconductor layer, for example, an inorganic PIN diode or an inorganic PN diode.

Still referring to FIG. 4, the channel layer 411 of the first TFT device is disposed right under a portion of the photosensitive semiconductor layer 415.

By disposing the channel layer 411 of the first TFT device right under a portion of the photosensitive semiconductor layer 415, the photosensitive semiconductor layer 415 may shield light to thereby prevent the light from reaching the channel layer 411, so as to avoid a signal leakage in the photosensitive device. Besides, as the photosensitive semiconductor layer 415 in the photosensitive device is employed to protect the channel layer 411 from light exposure, no extra structure is required, thereby saving process steps and cost.

In some embodiments, the channel layer 411 is disposed right under a portion of the photosensitive semiconductor layer 415, that is, a portion of the photosensitive semiconductor layer 415 is right over the channel layer 411 of the first TFT device, or at least a portion of the photosensitive semiconductor layer 415 is disposed over the channel layer 411. In some embodiments, an area of the photosensitive semiconductor layer 415 above the channel layer 411 (including right over the channel layer 411 and not right over the channel layer 411) may be set to be larger than an area of the channel layer 411, so as to ensure that a portion of the photosensitive semiconductor layer 415 is disposed over the channel layer 411, and a portion of the photosensitive semiconductor layer 415 is disposed above but not right over the channel layer 411. The portion of the photosensitive semiconductor layer 415 disposed above but not right over the channel layer 411 may further protect the channel layer 411 from light exposure to better avoid occurrence of the above-mentioned signal leakage.

Still referring to FIG. 4, in some embodiments, a portion of the lower electrode layer 414 may be also disposed over the channel layer 411. As a light-blocking layer, the lower electrode layer 414 may further prevent light from irradiating to the channel layer 411.

Still referring to FIG. 4, the gate layer 410 of the first TFT device is disposed below the channel layer 411. The optical fingerprint sensing circuit further includes an electrode layer 4100 disposed at a same layer as the gate layer 410. The electrode layer 4100 is disposed below the photosensitive device. A first insulating layer 401 is disposed between the electrode layer 4100 and the drain layer 413 of the photosensitive device. The electrode layer 4100 is connected with a common electrode (not shown in FIG. 4) which is connected with a constant potential.

In some embodiments, the entire electrode layer 4100 is disposed right under the photosensitive device. Thus, the entire electrode layer 4100 faces the photosensitive device.

In other embodiments, only a portion of the electrode layer is disposed right under the photosensitive device, to ensure that the electrode layer at least partially faces the photosensitive device.

In some embodiments, the electrode layer 4100 may be at least partially parallel with the photosensitive device. However, when the electrode layer 4100 faces the photosensitive device, and is at least partially parallel with the photosensitive device, and there is an insulating layer between the electrode layer 4100 and the drain layer 413 of the photosensitive device, a capacitance is formed between the electrode layer 4100 and the photosensitive device. The capacitance makes an equivalent capacitance of the photosensitive device increase, and the greater the equivalent capacitance, the larger the full well can be reached by the photosensitive device, and the larger the amount of charges that the photosensitive device can temporarily store, that is, the greater the amount of photoelectric signals the photosensitive device can temporarily store. In this way, the photosensitive device can acquire more light information, a contrast of fingerprint images may be increased, and quality of the acquired fingerprint images may be improved.

In the capacitance formed between the electrode layer 4100 and the photosensitive device, an upper electrode of the capacitance mainly includes a structure of the photosensitive device (which is also desired as a portion of the upper electrode), but also includes a portion of the drain layer 413. This is because, as described above, the drain layer 413 does not only include a portion as the drain of the first TFT device but also includes the other portion extending rightward which functions as conductive connection and is referred to as a drain connection layer (not labeled in FIG. 4, and can be referred to the above descriptions of the foregoing embodiments). However, as shown in FIG. 4, the other portion of the drain layer 413 is directly connected with the lower electrode layer 414 of the photosensitive device, and the electrode layer 4100 is also disposed right under the other portion of the drain layer 413. Therefore, when the capacitance is formed between the electrode layer 4100 and the photosensitive device, the other portion of the drain layer 413 may also serve as a part of the upper electrode of the capacitance.

In some embodiments, both the upper electrode layer 416 and the top electrode layer 423 are made of a light transmitting conductive material. The upper electrode layer 416 is connected with a first common electrode (not shown in FIG. 4) which is connected to a first constant potential. The top electrode layer 423 is connected with a second common electrode (not shown in FIG. 4) which is connected to a second constant potential. The top electrode layer 423 of the self-luminous device and the upper electrode layer 416 of the photosensitive device are connected to different constant potentials, respectively, to make the self-luminous device and the photosensitive device in a stable status and fewer electronic noises.

Still referring to FIG. 4, in the embodiment, the gate layer 410 is directly disposed on the upper surface of the substrate 400, thus the electrode layer 4100 is also directly disposed on the upper surface of the substrate 400. The gate layer 410 and the electrode layer 4100 may be formed using a same process at the same time, thereby saving process steps and saving cost.

Still referring to FIG. 4, the self-luminous display pixel includes the first insulating layer 401 which covers the substrate 400, the gate layer 410 and the electrode layer 4100. A portion of the first insulating layer 401 which is disposed between the gate layer 410 and the channel layer 411 serves as a gate dielectric layer of the first TFT device. A portion of the first insulating layer 401 which is disposed between the electrode layer 4100 and the drain layer 413 serves as an insulating layer of a capacitance formed by the electrode layer 4100 and the photosensitive device. The source layer 412, the drain layer 413 and the channel layer 411 are disposed on the first insulating layer 401.

Still referring to FIG. 4, the self-luminous display pixel includes a second insulating layer 402 which covers the source layer 412, the drain layer 413 and the channel layer 411. A portion of the lower electrode layer 414 penetrates through the second insulating layer 402 to be electrically connected with the drain layer 413, that is, the lower electrode layer 414 is directly connected with the drain layer 413 of the first TFT device. Besides, a portion of the lower electrode layer 414 is disposed on an upper surface of the second insulating layer 402. Besides, a portion of the bottom electrode layer 421 is directly disposed on the upper surface of the second insulating layer 402, and the other portion of the bottom electrode layer 421 penetrates through the second insulating layer 402 to be electrically connected with the TFT devices in a corresponding self-luminous circuit. As described above, the region enclosed by the dotted box D in FIG. 4 denotes to a region where the TFT devices of the self-luminous circuit are located.

Still referring to FIG. 4, the self-luminous display pixel includes a third insulating layer 403 which is disposed on the second insulating layer 402. The portion of the lower electrode layer 414 on the upper surface of the second insulating layer 402 is covered by the third insulating layer 403. The portion of the bottom electrode layer 421 on the upper surface of the second insulating layer 402 is also covered by the third insulating layer 403. In addition, the third insulating layer 403 surrounds the self-luminous semiconductor layer 422 and the top electrode layer 423, and an upper surface of the third insulating layer 403 is substantially flush with the upper surface of the top electrode layer 423 (in other embodiments, the upper surface of the third insulating layer may be higher than the upper surface of the top electrode layer). The third insulating layer 403 surrounds the photosensitive semiconductor layer 415 and the upper electrode layer 416, and the upper surface of the third insulating layer 403 is substantially flush with the upper surface of the upper electrode layer 416 (in other embodiments, the upper surface of the third insulating layer may be higher than the upper surface of the upper electrode layer). That is, a sidewall of the self-luminous semiconductor layer 422 and a sidewall of the photosensitive semiconductor layer 415 are covered by the third insulating layer 403.

In some embodiments, the second insulating layer 402 may be referred to as a TFT protective layer, that is, the self-luminous display pixel further includes a TFT protective layer. It can be seen that the first TFT device was covered by the TFT protective layer, and at least a portion of the photosensitive semiconductor layer 415 and at least a portion of the self-luminous semiconductor layer 422 are disposed above the upper surface of the TFT protective layer.

In some embodiments, a portion of the lower electrode layer 414 penetrates through the second insulating layer 402, a portion of the lower electrode layer 414 is disposed on the upper surface of the second insulating layer 402, and a top view area of the portion of the lower electrode layer 414 on the upper surface of the second insulating layer 402 is larger than a top view area of the portion of the lower electrode layer 414 penetrating through the second insulating layer 402. As shown in FIG. 4, width of the portion of the lower electrode layer 414 on the upper surface of the second insulating layer 402 is greater than width of the portion of the lower electrode layer 414 penetrating through the second insulating layer 402, while a top view area of the photosensitive semiconductor layer 415 is generally equal to a top view area of the lower electrode layer 414. With this structure, the overall area of the photosensitive semiconductor layer 415 is larger than the area of the portion of the lower electrode layer 414 disposed in the second insulating layer 402, so that the photosensitive semiconductor layer 415 has a relatively large area to receive light, which is advantageous for obtaining fingerprint images with a higher resolution.

In some embodiments, a light blocking wall may be disposed between the self-luminous device and the photosensitive device, which may be referred to the above descriptions of the foregoing embodiments.

In some embodiments, a light collimating layer may be disposed on the photosensitive device, which may be referred to the above descriptions of the foregoing embodiments.

More details about structures, properties and advantages of the self-luminous display pixel can be found in the above descriptions of the foregoing embodiments.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A self-luminous display pixel, comprising:
   a self-luminous circuit which comprises a self-luminous device,
   wherein the self-luminous display pixel further comprises an optical fingerprint sensing circuit,
   wherein the optical fingerprint sensing circuit comprises a first Thin Film Transistor (TFT) device and a photosensitive device, and a channel layer of the first TFT device is disposed right under a portion of the photosensitive device,
   wherein a gate layer of the first TFT device is disposed below or above the channel layer of the first TFT device, and the optical fingerprint sensing circuit further comprises an electrode layer which is disposed at a same layer as the gate layer and below the photosensitive device, wherein the electrode layer is at least partially parallel with the photosensitive device, an insulating layer is disposed between the electrode layer and the photosensitive device, and the electrode layer is connected with a common electrode which is connected to a constant potential,
   wherein the photosensitive device further comprises an upper electrode layer, the upper electrode layer being connected with a first common electrode which is connected to a first constant potential, wherein the self-luminous device comprises a top electrode layer, the top electrode layer being connected with a second common electrode which is connected to a second constant potential.

2. The self-luminous display pixel according to claim 1, wherein the photosensitive device further comprises a lower electrode layer which is a light-blocking layer, the channel layer of the first TFT device is disposed right under a portion of the lower electrode layer, and the photosensitive device comprises a photosensitive semiconductor layer which is a PIN diode or a PN diode.

3. The self-luminous display pixel according to claim 1, wherein the photosensitive device comprises a photosensitive semiconductor layer, the self-luminous device comprises a self-luminous semiconductor layer, and the self-luminous display pixel further comprises a TFT protective layer, wherein the photosensitive semiconductor layer and the self-luminous semiconductor layer are disposed above an upper surface of the TFT protective layer, and the photosensitive semiconductor layer is a PIN diode or a PN diode.

4. The self-luminous display pixel according to claim 3, wherein the photosensitive device further comprises a lower electrode layer which is a light-blocking layer.

5. The self-luminous display pixel according to claim 1, wherein a light blocking wall is disposed between the self-luminous device and the photosensitive device.

6. The self-luminous display pixel according to claim 1, wherein light emitted from the self-luminous device is reused by the photosensitive device for fingerprint imaging.

7. The self-luminous display pixel according to claim 1, wherein a light blocking layer is disposed on the photosensitive device over the channel layer of the first TFT device.

8. The self-luminous display pixel according to claim 1, wherein a light collimator layer is disposed above the photosensitive device.

\* \* \* \* \*